United States Patent [19]
Yang et al.

[11] Patent Number: 5,429,980
[45] Date of Patent: Jul. 4, 1995

[54] METHOD OF FORMING A STACKED CAPACITOR USING SIDEWALL SPACERS AND LOCAL OXIDATION

[75] Inventors: Ming-Tzong Yang, Hsin Chu; Anchor Chen, Chu-Tung; Chen-Chiu Hsue, Hsin Chu, all of Taiwan

[73] Assignee: United Microelectronics Corporation, Hsinchu, Taiwan

[21] Appl. No.: 318,423

[22] Filed: Oct. 5, 1994

[51] Int. Cl.[6] .................... H01L 21/70; H01L 21/00
[52] U.S. Cl. ............................ 437/52; 437/60; 437/919
[58] Field of Search ............... 437/47, 52, 60, 919

[56] References Cited

U.S. PATENT DOCUMENTS

| | | | |
|---|---|---|---|
| 5,061,650 | 10/1991 | Dennison et al. | 437/47 |
| 5,084,405 | 1/1992 | Fazan et al. | 437/52 |
| 5,126,916 | 6/1992 | Tseng | 361/313 |
| 5,158,905 | 10/1992 | Ahn | 437/52 |
| 5,192,702 | 3/1993 | Tseng | 437/47 |
| 5,217,914 | 6/1993 | Matsumoto et al. | 437/47 |
| 5,227,322 | 7/1993 | Ko et al. | 437/47 |
| 5,266,514 | 11/1993 | Tuan et al. | 437/52 |
| 5,380,675 | 1/1995 | Hsue et al. | 437/52 |

OTHER PUBLICATIONS

"A Newly Designed Planar Stacked Capacitor Cell with High Dielectric Constant Film for 256 Mbit DRAM" by T. Eimori et al. IEEE International Electron Device Meeting Proceedings, Dec. 1993, pp. 631-634.

*Primary Examiner*—Olik Chaudhuri
*Assistant Examiner*—H. Jey Tsai
*Attorney, Agent, or Firm*—George O. Saile

[57] ABSTRACT

A method for fabricating a capacitors on a dynamic random access memory (DRAM) cell having increased capacitance was achieved. The capacitor is fabricated on a silicon substrate having an active device region. The device region contains a field effect transistor (FET), having one capacitor aligned over and contacting the source/drain of the FET in the device region. The capacitor is increased in capacitance by forming a double recess in the bottom electrodes of the storage capacitors. The method of forming the double recess utilizes a sidewall spacer and local oxidation technique. After forming the bottom electrode having the double recess an insulating layer having a high dielectric constant is deposited as the inter-electrode insulator and a stop electrode is formed, completing the storage capacitor and the dynamic random access memory (DRAM) storage cell.

22 Claims, 6 Drawing Sheets

METHOD OF FORMING A STACKED CAPACITOR USING SIDEWALL SPACERS AND LOCAL OXIDATION

BACKGROUND OF THE INVENTION (1) Field of The Invention

This invention relates to a random access memory device and, more particularly, to a method of fabricating a three-dimensional stacked capacitors having increased capacitance.

(2) Description of The Prior Art

Very large scale integration (VLSI) semiconductor technologies have dramatically increased the circuit density on the chip. The miniaturized devices built in and on the semiconductor substrate, making up these circuits are very closely spaced and their packing density has increased significantly. Future requirements for even greater increases in packing density is putting additional demand on the semiconductor technologies and more particularly on the photolithographic techniques.

The dynamic random access memory (DRAM) chip having an array of charge storage cells is one circuit type that is experiencing increasing demand for higher packing density. These individual DRAM storage cells, consisting usually of a single metal-oxide-semiconductor field-effect transistor (MOSFET) and a single capacitor, are used extensively in the electronics industry for storing data. A single DRAM storage cell stores a bit of data on the capacitor as electrical charge.

However, as the array of cells on the DRAM chip increase in number and the capacitor decrease in size, it becomes increasingly difficult to maintain sufficient charge on the storage capacitor to maintain an acceptable signal-to-noise level. Also, these volatile storage cells require more frequent refresh cycles in order to retain their charge.

These storage capacitors are formed either in the substrate, usually referred to as trench capacitors, or by forming stacked capacitors on the substrate after first fabricating the field effect transistors. The latter method has received considerable attention in recent years. However, since each capacitor in the array of storage cells are confined within the cell area, it is difficult to maintain sufficient capacitance as the cell size decreases. Therefore, it becomes necessary to explore other methods for increasing the capacitance.

Some methods for increasing capacitance include building a three dimensional capacitor structure extending vertically upward over the cell area. For example, see H-H Tseng U.S. Pat No. 5,192,702 and U.S. Pat. No. 5,126,916 and C. H. Dennison et al U.S. Pat. No. 5,061,650. Others have utilized sidewall techniques to build vertical capacitor structures, such as described by P. Fazan et al in U.S. Pat. No. 5,084,405 and S Matsumoto et al U.S. Pat. No. 5,217,914. Another approach is to roughen the surface of the bottom electrode of the capacitor to effectively increase the surface area without increasing its overall size. For example, see H. C. Tuan et al U.S. Pat. No. 5,266,514. Another technique for increasing the surface area by forming a villus-type capacitor is described by J. Ahn in U.S. Pat. No. 5,158,905 and a technique for forming a porous structure is described by J. Ko in U.S. Pat. No. 5,227,322. Still another approach is to use inter-electrode insulators having high dielectric constants. For example see the publication "A Newly Designed Planar Stacked Capacitor Cell with High Dielectric Constant Film for 256 Mbit DRAM" by T. Eimori et al IEEE International Electron Device Meeting Proceedings, Dec. 1993 pages 631-634.

Although there has been considerable work done to increase the capacitance area on these very small storage capacitors, it is still desirable to further improve these capacitors while retaining as simple a process as possible to maintain high chip yields, low cost and good reliability. This is especially true as the DRAM increase to 256 Mbits on a chip.

SUMMARY OF THE INVENTION

Accordingly, it is a principal object of this invention to provide a three dimensional stacked capacitor having increased capacitance.

It is another object of the present invention to provide a method for fabricating these stacked capacitors using a sidewall spacer technique and a local oxidation process.

It is still another object of the invention to increase the capacitance while maintaining a simple manufacturing process.

This invention addresses these objects by teaching a method for forming a bottom electrode having very narrow self-aligned vertical recess structures thereby increasing the capacitor area. To accomplish these objectives a sidewall spacer technique and local oxidation technique is used to pattern the polysilicon layer forming the bottom electrode of the DRAM cell storage capacitors.

In summary then, after forming an array of active device areas surrounded and isolated from each other by a relatively thick field oxide, a charge passing transistor is formed in each active device region. The transistor is usually a metal-oxide-semiconductor field effect transistor (MOSFET) having source/drain contacts. The gate electrode of the transistor is formed from a doped polysilicon layer, which is patterned using conventional photolithographic techniques and etching. The patterned polysilicon layer also serves as the word line conductors elsewhere on the DRAM chip. Next, a insulating layer, usually composed of silicon dioxide and silicon nitride, is formed over the MOSFET and word line polysilicon pattern, and a contact opening is formed in the insulator to one of the two source/drain contacts. This contact is now used to make electrical contact to the bottom electrode of the stacked capacitor. The contact is commonly referred to as the storage capacitor node contact.

The bottom electrode of the stacked capacitor is then formed by depositing a relatively thick polysilicon layer having an insulating layer deposited thereon, such as silicon oxide. The silicon oxide layer is then patterned, forming a ringed opening over and aligned to the capacitor electrode area and having silicon oxide elsewhere on the silicon substrate. A third insulating layer, being substantially different in composition and forming an oxidation barrier layer, is deposited over the silicon oxide and in the ringed opening. The preferred insulator being a silicon nitride. The silicon nitride is then anisotropically etched to form sidewall spacers on both the inside and outside walls of the silicon oxide ringed opening. The exposed surface of the first polysilicon layer is partially oxidize and then the silicon nitride side walls are removed forming a doubled ringed patterned opening with oxide masking over other portions of the polysilicon surface. The first polysilicon layer is then etched part way to form the vertical recesses over and in the bottom electrode. Then a conventional photolithographic technique and etching is used to pattern the first polysilicon layer to the first insulating layer forming and electrically isolating the bottom electrode from other electrodes made simultaneously on the DRAM chip. A high dielectric insulating layer is deposited to form the inter-electrode insulator and a second polysilicon layer is deposited to form the top electrode and complete the stacked storage capacitors.

BRIEF DESCRIPTION OF THE DRAWINGS

The objects and advantages of this invention are best understood by the following embodiment with reference to the attached drawings which are now briefly described.

DESCRIPTION OF THE PREFERRED EMBODIMENTS

Now in keeping with the objects of this invention, the method for forming the stacked capacitor with increased capacitance is covered in detail. The sequence of fabrication steps are shown in FIGS. 1 to 11. This storage capacitor can be fabricated on a N-channel MOSFET structures which are currently used in the manufacture of DRAMS. Therefore, only a brief description of the MOSFET structure is given, sufficient for understanding the current invention.

It should also be well understood by one skilled in the art that by including additional process steps, in addition to those described in this embodiment, other types of devices can also be included on the DRAM chip, For example, P channel MOSFETs can be formed by providing N-Wells in the P substrate and complementary metal-oxide semiconductor (CMOS) circuits can also be formed therefrom.

Figure 1:
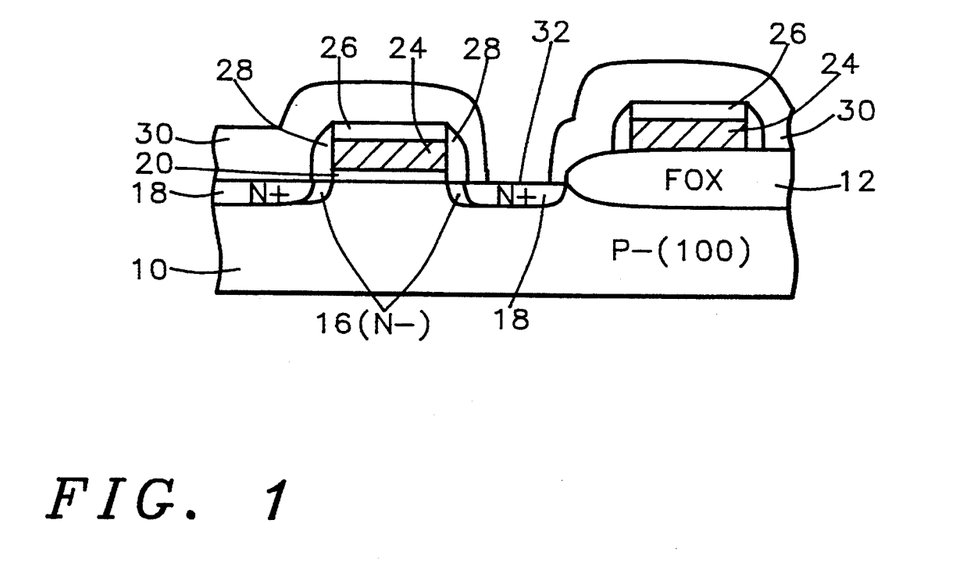
FIGS. 1 through 11 are schematic cross-sectional representation of the embodiment of the method for fabricating the stacked capacitor of this invention on a conventional field effect transistor, commonly used in a DRAM storage cell.

Referring now to FIG. 1, a cross-sectional view of the substrate 10 having a partially completed DRAM cell formed on and in the substrate surface, is schematically shown. The preferred substrate is composed of a P-type single crystal silicon having a <100> crystallographic orientation. A relatively thick Field OXide (FOX) 12 is formed around the active device regions to isolate these individual device regions. This field oxide, only partially shown in FIG. 1, is formed by depositing a thin silicon oxide (pad oxide) and a thicker silicon nitride ($Si_3N_4$) layer as an oxidation barrier layer. Conventional photolithographic techniques and etching are then used to remove the barrier layer in areas where a field oxide is desired while retaining the silicon nitride areas where active device are to be fabricated. The silicon substrate is then oxidized to form the field oxide. The preferred thickness is between about 2500 to 8000 Angstroms.

The semiconductor device is then formed in the active device regions after removing the silicon nitride barrier layer and pad oxide in a wet etch. The most commonly used device for dynamic random access memory is the metal-oxide-semiconductor field-effect transistor (MOSFET). This device is formed by first thermal oxidizing the active device region to form a thin gate oxide 20. The preferred thickness being from about 90 to 200 Angstroms. An appropriately doped polysilicon layer 24 and an insulating layer 26 are deposited and conventional photolithographic techniques and etching are used to pattern the insulator 26 and polysilicon 24. This forms the gate electrode 24 for the MOSFET in the active device regions and conducting patterns elsewhere on the substrate with the insulating layer 26 thereon. These conducting patterns form the word lines that electrically connect the MOSFET gate electrode to the appropriate peripheral circuits on the DRAM chip. The lightly doped source/drain 16 are formed next, usually by implanting a N-type dopant species such as arsenic or phosphorus. For example, a typical implant might consist of phosphorus $p^{31}$ at a dose of between 1 E 13 to 10 E 13 atoms/$cm^2$ and an energy of between about 30 to 80 Kev.

After forming the lightly doped source/drain, sidewall spacers 28 are formed on the gate electrode sidewalls. These sidewall spacers are formed by depositing a low temperature silicon oxide and anisotropically etching back to the silicon surface. For example, the silicon oxide could be a chemical vapor deposition using tetraethoxysilane (TEOS) at a temperature in the range of about 650° to 900 ° C. and the etch back performed in a low pressure reactive ion etcher. The N+ source/drain implantation is used to complete the source/drain regions 18. For example, arsenic ($As^{75}$) can be implanted at a dose of between 2 E 15 to 1 E 16 atoms/$cm^2$ and energy of between about 20 to 70 Kev. Alternatively, the source/drain contacts can be completed at a later process step whereby the dopant is out diffused from a polysilicon layer.

The remainder of this embodiment relates more specifically to the objects of this invention, which addresses in detail the method of forming a double ringed recesses in the bottom electrodes for increasing the electrode area. The invention utilizes a sidewall spacer technique and a local silicon oxidation method that forms two closely spaced recesses over and in the capacitor area.

still referring to FIG. 1, the active device area having the MOSFET therein and the word lines over the field oxide are insulated by depositing a first insulating layer 30 which may be formed by a chemical vapor deposition (CVD) of silicon oxide. Alternatively, the first insulating layer 30 can be composed of a silicon oxide layer and a silicon nitride layer as a barrier to impurity ion diffusion which can degrade device electrical characteristics. The preferred thickness of the silicon oxide layer is from between about 1000 to 4000 Angstroms, and the preferred thickness of the silicon nitride layer is from about 200 to 1000 Angstroms. The preferred deposition process for the silicon oxide is performed in a low pressure chemical vapor deposition (LPCVD) reactor at a temperature in the range between about 300° to 500° C. The process of choice for the silicon nitride is also a deposition in a LPCVD reactor at a temperature in the range of between about 650° to 800 ° C.

A conventional photolithographic technique and etching is used to define the contact opening 32 to one of the two source/drain contact of the MOSFET, as is also shown in FIG. 1. This contact opening 32 is typically formed by anisotropically etching in a reactive ion etcher having a high etch rate selective of silicon oxide to silicon. The high selectivity is used to avoid over etching the silicon contact. This contact opening provides the storage node contact to the source/drain contact for the bottom capacitor electrode which is next formed.

Figure 2:
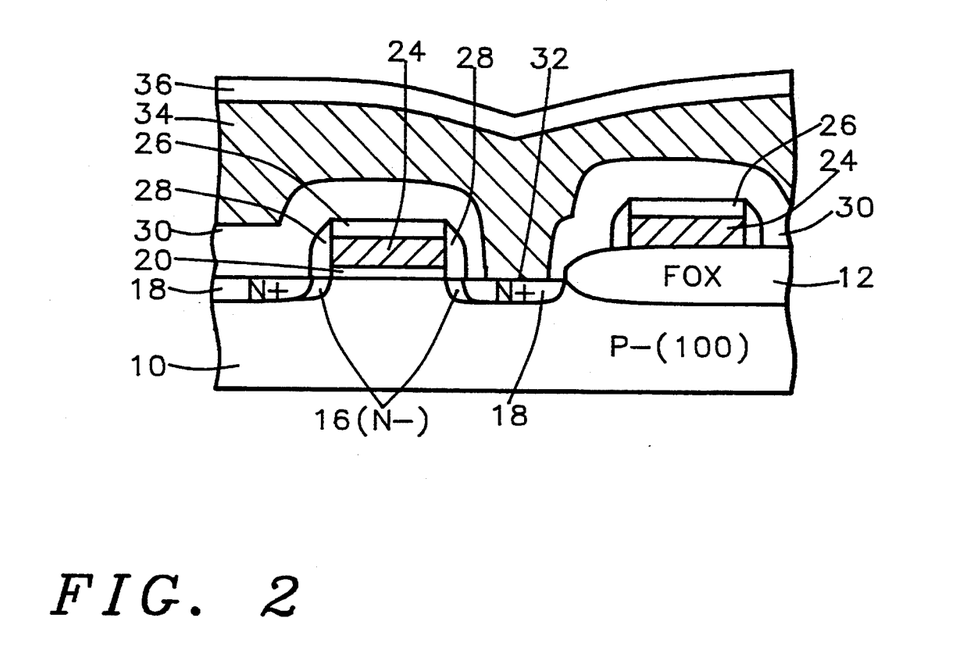

Referring now to FIGS. 2 through 7, there is shown the technique for forming the bottom electrode having the double recess for increasing the surface area and hence the capacitance. The process starts by depositing a relatively thick conformal first polysilicon layer 34 over the first insulating layer 30 and into the contact opening 32 making contact to the source/drain region of the MOSFET and forming the storage node contact, as shown in FIG. 2. The preferred deposition of layer 34 is done in a low pressure chemical vapor deposition (LPCVD) reactor and the thickness is preferably of between about 1000 to 10000 Angstroms. The polysilicon layer 34 is then doped either by implantation or alternatively by in situ doping during the polysilicon deposition. The preferred dopant is of a N-type dopant species, such as arsenic ($As^{75}$) or phosphorous ($p^{31}$) and having a concentration in the range of between about 1 E 19 to 1 E 22 atoms/$cm^3$.

A second insulating layer 36 is formed over the first polysilicon layer 34, as shown in FIG. 2. This layer 36 is composed of silicon oxide and the preferred deposition is by Atmospheric Pressure Chemical Vapor Deposition (APCVD) at a temperature of between about 350° to 600 ° C. Alternatively, layer 36 can be deposited using Low Pressure Chemical Vapor Deposition (LPCVD) in the temperature range of between about 350° to 800 ° C., or deposited by Plasma Enhanced Chemical Vapor Deposition (PECVD) at a temperature between about 200° to 500 ° C. The thickness of layer 36 is between about 500 to 10000 Angstroms.

Figure 3:
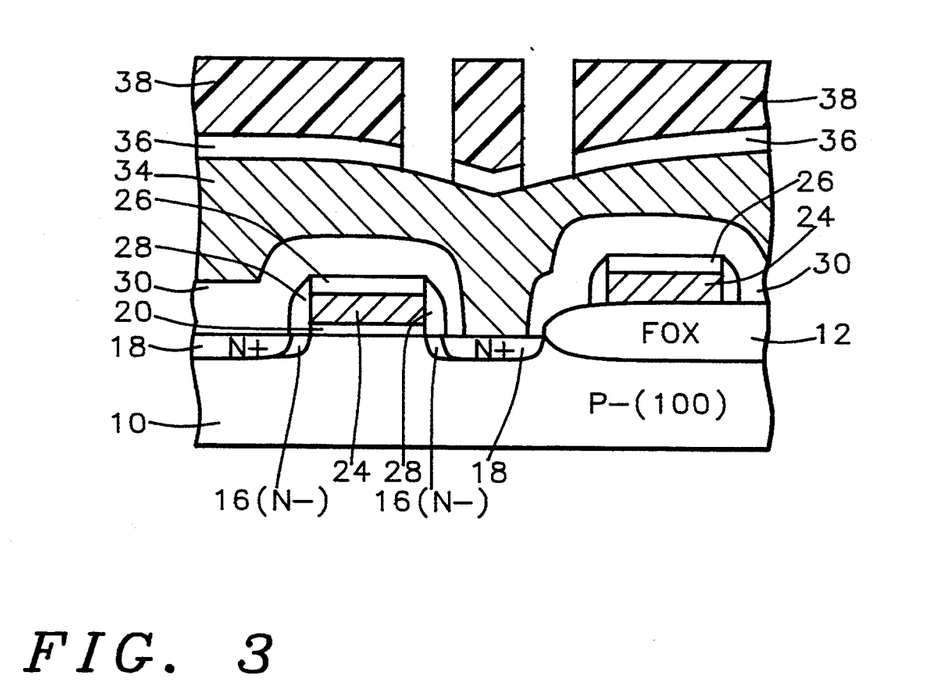

Referring now to FIG. 3, conventional photolithographic techniques and anisotropic etching are used to form over and within the capacitor area a ringed opening in the insulating layer 36. The silicon oxide opening with the patterned photoresist layer 38 still in place is shown in FIG. 3. The etching is accomplished in a low pressure reactive ion etcher (RIE) or in a magnetically enhanced RIE (MERIE). The etch gas mixture of choice is one that inhibits sidewall etching and has a good etch selectivity to polysilicon. For example, the etching can be carried out in a gas mixture containing trifluoromethane ($CHF_3$) and argon (Ar).

Figure 4:
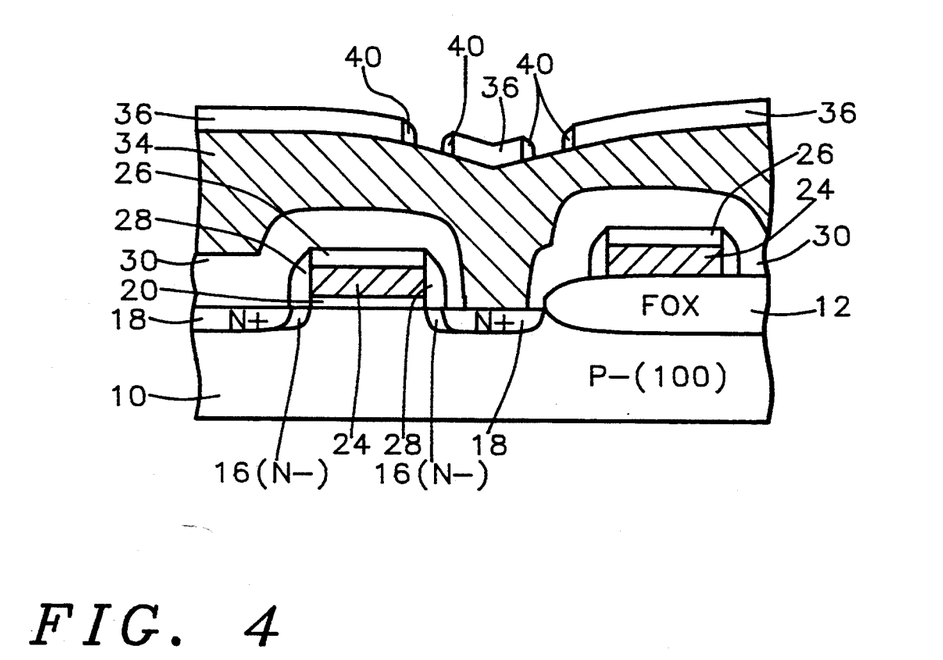

The photoresist layer 38 is now removed, as shown in FIG. 4. A third insulating layer 40, having good comformality, is deposited over the silicon oxide layer 36 and in the oxide opening and is etched back to form sidewall spacers. The layer 40 composition is substantially different from layer 36. The composition of choice for layer 40 is silicon nitride ($Si_3N_4$) because both its oxidation barrier properties and its wet etch characteristics are substantially different from silicon oxide. The thickness of the $Si_3N_4$ layer is preferably between about 300 to 5000 Angstroms and the preferred deposition is a low pressure chemical vapor deposition (LPCVD) at a deposition temperature in the range of between 500° to 700 ° C. The silicon nitride layer 40 is now anisotropically etched back to the silicon oxide layer 36 and to the first polysilicon layer 34 within the oxide opening and forming sidewall spacers 40 on the sidewalls within the openings of layer 36, as shown in FIG. 4. The width of the ringed oxide opening and the width of the silicon nitride spacers 40 are chosen such that the polysilicon layer 34 remains exposed between the silicon nitride spacers 40.

Figure 5:
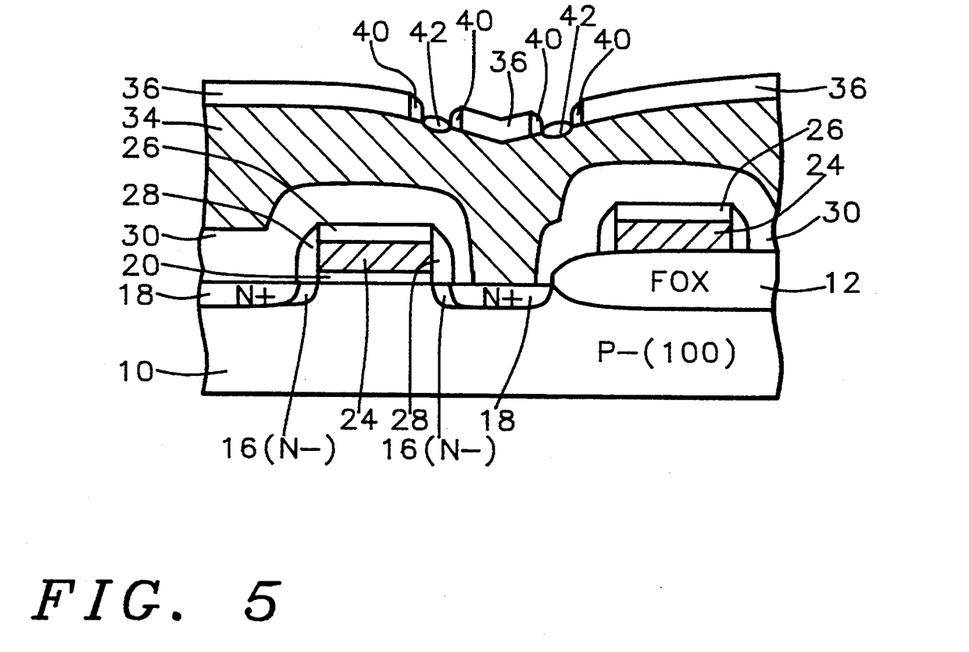

Referring now to FIG. 5, the silicon nitride spacers 40 are used as an oxidation mask and the exposed surface of the first polysilicon layer 34, within the oxide opening of layer 36 is thermally oxidized. This oxidation resulting in a patterned silicon oxide layer 42 centered and aligned between the sidewalls of the ringed opening in the silicon oxide layer 36. The preferred thickness of the thermal oxide is between about 200 to 2000 Angstroms.

Figure 6:
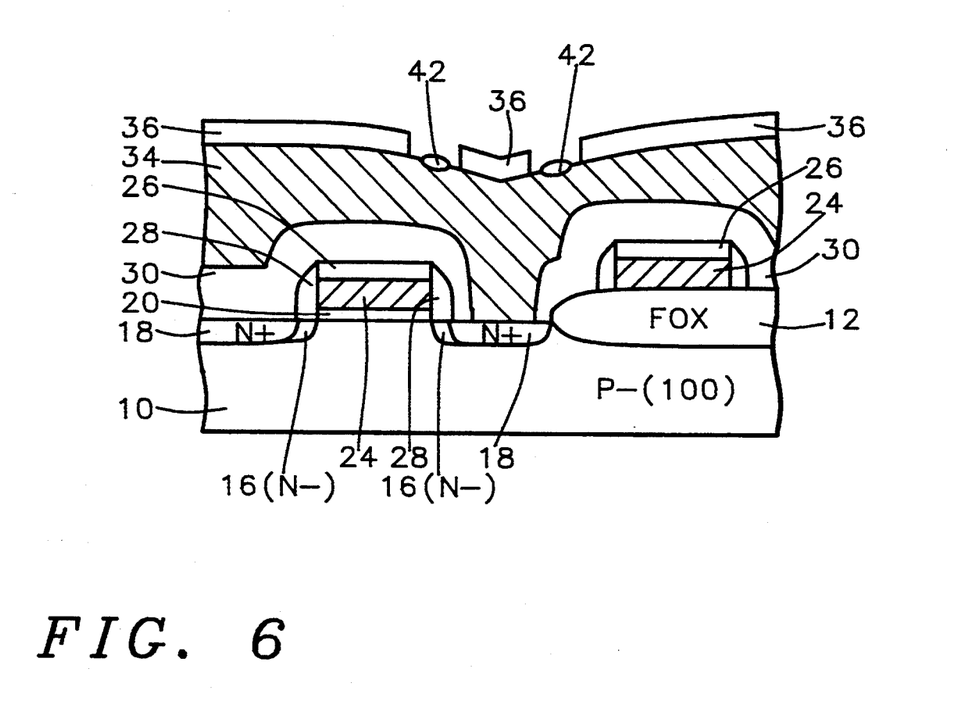
Figure 7:
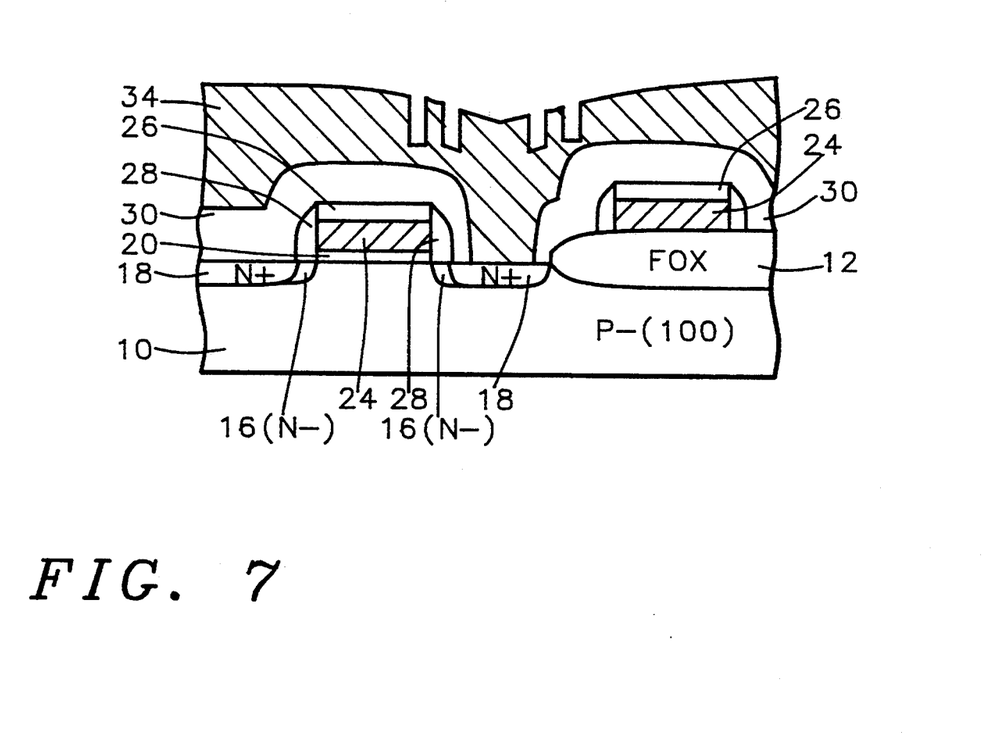

The silicon nitride sidewall spacers 40 are now completely removed leaving remaining on the surface of the first polysilicon layer 34 a silicon oxide layer 36 with a ringed opening and having a silicon oxide mask 42 formed therein, as shown in FIG. 6. The silicon nitride spacers 40 are removed using a hot phosphoric acid solution, as is commonly used in the industry. The combined patterns of layer 36 and layer 42 are now used as an etch mask for etching anisotropically the doubled ringed recesses in the first polysilicon layer 34 and then the silicon oxide mask is completely removed, for example, by etching in a hydrofluoric acid solution as shown in FIG. 7. These recesses being over and aligned to the storage node contact 32 of the MOSFET and also aligned and over the desired bottom capacitor electrode area. The preferred method of etching the polysilicon recesses is in a reactive ion etcher (RIE) and a preferred etch gas mixture having a high etch rate ratio between polysilicon and silicon oxide. For example, a gas containing chlorine species can be used.

Figure 8:
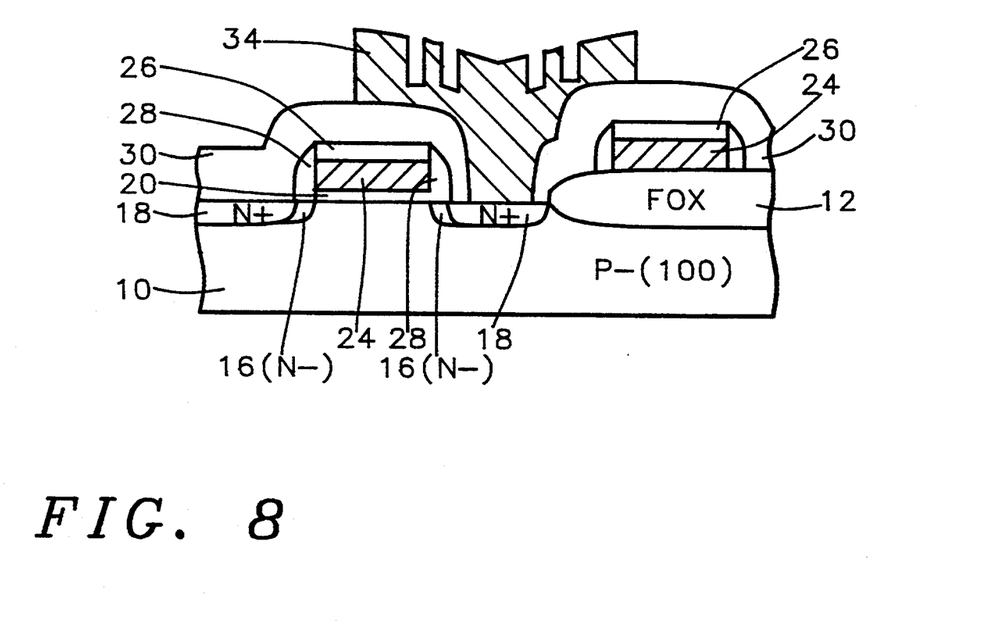

Referring now to FIG. 8, conventional photolithographic techniques are used again to mask the first polysilicon layer 34 over the bottom electrode area and anisotropically etched to form the bottom electrode with vertical outer sidewalls. The polysilicon layer 34 is etched to the first insulating layer 30. This etch step forms the bottom electroder electrically isolating the bottom electrode from adjacent electrodes that are formed concurrently with the same process steps. Only one bottom electrode is depicted, in FIG. 8, after the photoresist is removed, but it should be well understood by one skilled in the art that other electrodes are formed elsewhere on the substrate concurrently forming an array of bottom electrodes aligned over other DRAM cells on the chip.

Figure 9:
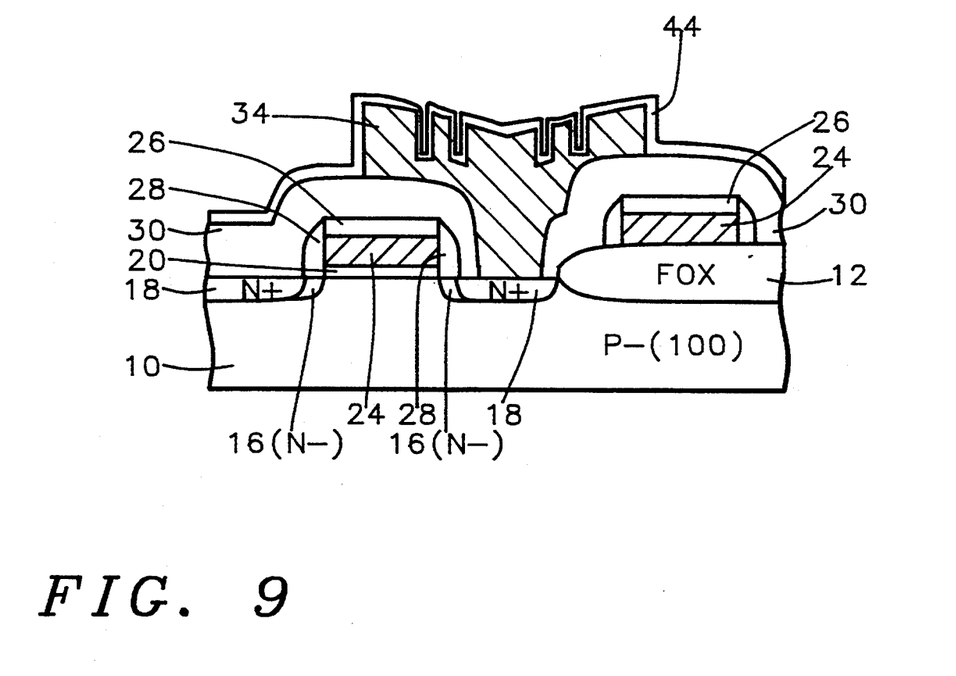

Referring now to FIG. 9, a thin dielectric layer 44, having a high dielectric constant, is deposited on and around the bottom electrodes forming the inter-electrode dielectric. Preferably the dielectric layer 44 is composed of a silicon oxide/silicon nitride layers having a total thickness of between about 40 to 150 Angstroms. Alternatively, other insulating materials having a high dielectric constant can also be used, such as tantalum pentoxide ($Ta_3O_5$), $Ba_{1-x}Sr_xTiO_3$ (BST) and silicon oxide/silicon nitride/silicon oxide (ONO).

Figure 10:
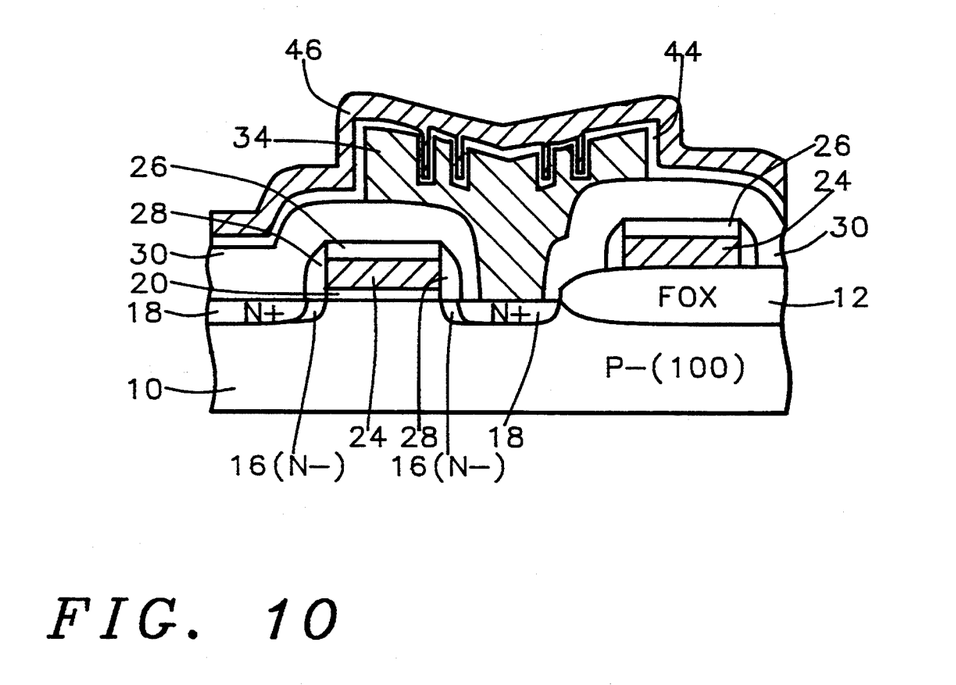

As shown in FIG. 10, a second polysilicon layer 46 is deposited forming the top electrode of the storage capacitor and forming the top electrode elsewhere on the DRAM chip completing the array of storage capacitors. The preferred thickness of polysilicon 46 is from between about 300 to 5000 Angstroms and is doped with N-type impurity, such as arsenic and phosphorus species. The preferred concentration being in the range between about 1 E 19 to 1 E 21 atoms/$cm^3$.

Figure 11:
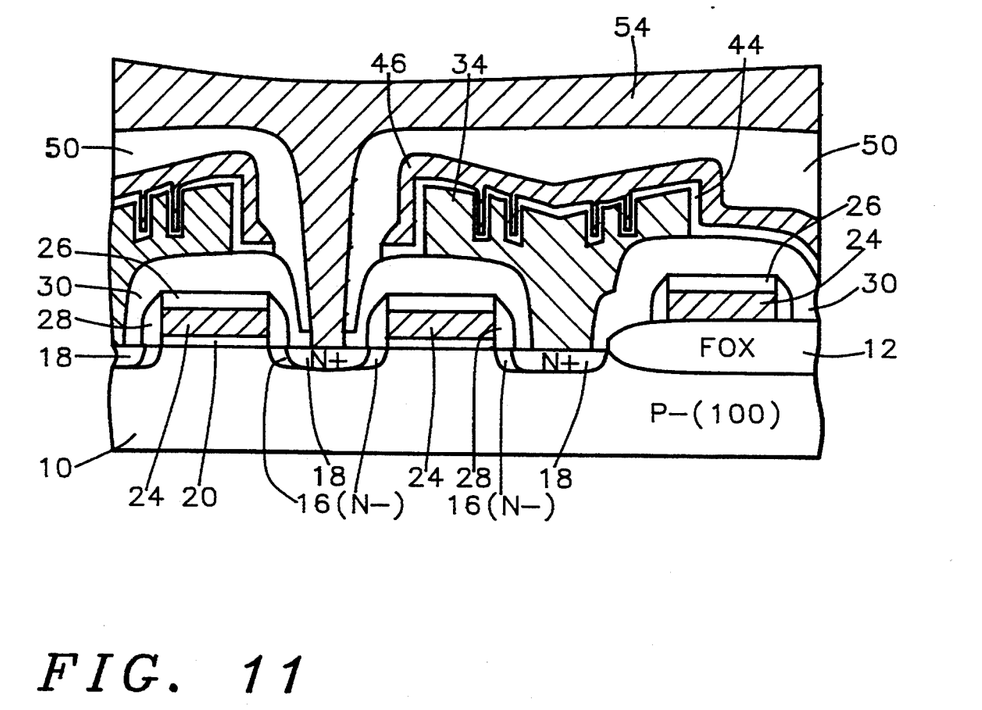

Referring now to FIG. 11, a cross sectional view of a single completed DRAM cell of an array of cells is shown. Also, shown to the left in the figure, is a partial view of an adjacent DRAM cell. To complete the DRAM cell, a second insulating layer 50 is deposited over the cell. The preferred second insulator layer 50 is a material of low flow temperature glass composed of borophosphosilicate glass (BPSG) having a thickness in the range of about 2000 to 10000 Angstroms. The BPSG is then annealed to planarize the surface to accommodate the bit line metallurgy. The bit line contact mask and appropriate photolithographic process is used to open a contact in the BPSG insulating layer 50 and the first insulating layer 30 to the second of the two source/drain contacts of the MOSFET. A third polysilicon layer 54 is deposited and doped N-type impurities to form the bit line metallurgy. The preferred thickness of layer 54 is between 3000 to 15000 Angstroms. Furthermore, a silicide layer can be formed thereon to increase its conductivity. The preferred method being the deposition of a thin metal layer followed by a low temperature anneal to form the silicide. The preferred metal silicide being a tungsten silicide (WSi). Alternatively, the bit line metallurgy can be a metal. For example, aluminum (Al) can be used for the bit line with a barrier layer formed of tungsten (W) or titanium (Ti) used to prevent aluminum penetration in the source/drain contact. The polysilicon/silicide or metal bit lines are then formed by using conventional photolithographic techniques and etching to complete the DRAM storage cell.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a stacked storage capacitor over a semiconductor substrate having device areas and word lines formed therein comprising the steps of:
    depositing a first insulating layer over said device areas, word lines and elsewhere over said substrate;
    forming opening in said first insulating layer to said device area and providing contact opening for a said storage capacitor node contact to said device area;
    depositing a first polysilicon layer over and in said contact opening and elsewhere on said substrate and making electrical node contact for said storage capacitor to said device area;
    depositing a second insulating layer over said first polysilicon layer; and
    masking and anisotropically etching an opening in said second insulating layer over and within said storage capacitor area and aligned to said node contact;
    depositing a third insulating layer over and in said opening and elsewhere over said second insulating layer having a different composition from said second insulating layer and forming a diffusion barrier to oxidizing atomic species;
    anisotropically etching back said third insulating layer to surface of said first polysilicon layer in said opening and forming sidewall spacers on said second insulating layer sidewalls;
    thermally and partially oxidizing said first polysilicon layer between said sidewall spacers and forming a thermal oxide layer centered in said second insulator opening;
    removing completely said sidewall spacers between said second insulating layer and said thermal oxide layer thereby forming an etch mask for said first polysilicon layer;
    anisotropically and partially etching said first polysilicon layer forming a spaced doubled recessed trench in said first polysilicon layer;
    removing completely said thermal oxidized layer and said second insulating layer;
    selectively patterning said first polysilicon layer to said first insulating layer over said device area and forming a bottom capacitor electrode
    depositing a dielectric layer over said bottom electrode and forming an inter-electrode insulating layer;
    depositing a second polysilicon layer over said dielectric layer forming a top capacitor electrode and completing said stacked storage capacitor.

2. The method of claim 1 wherein the composition of said first insulating layer is a layer of silicon oxide having a thickness of between 1000 to 8000 Angstroms.

3. The method of claim 1, wherein the thickness of said first polysilicon layer is between about 500 to 10000 Angstroms.

4. The method of claim 1, wherein said first polysilicon layer is deposited by chemical vapor deposition and having a thickness between about 500 to 10000 Angstroms.

5. The method of claim 4, wherein said first polysilicon layer is doped N-type having a concentration of between about $1 E 19$ to $1 E 22$ atoms/cm$^3$.

6. The method of claim 1, wherein said second insulating layer is silicon oxide having a thickness between about 800 to 5000 Angstroms.

7. The method of claim 1, wherein said third insulating layer is silicon nitride having a thickness between 300 to 5000 Angstroms.

8. The method of claim 1, wherein said partial thermal oxide layer in said exposed polysilicon area is between about 200 to 2000 Angstroms in thickness.

9. The method of claim 1, wherein said partial etch depth of said first polysilicon layer is between about 900 to 9000 Angstroms.

10. The method of claim 1, wherein said inter-electrode insulating layer is composed of silicon oxide and silicon nitride.

11. The method of claim 1, wherein said node contact is a source/drain area of a metal-oxide-semiconductor field-effect-transistor (MOSFET) and said storage capacitor is a part of a DRAM cell.

12. A method for fabricating a dynamic random access memory (DRAM) cell with a metal-oxide-semiconductor field-effect-transistor (MOSFET) having device source/drains and a storage capacitors formed on and in a semiconductor substrate therein comprising the steps of forming said storage capacitor:
    depositing a first insulating layer over said device source/drain and elsewhere over said substrate;
    forming opening in said first insulating layer to said device source/drain and providing contact opening for making a storage capacitor contact to said device source/drain;
    depositing a first polysilicon layer over and in said contact opening and elsewhere on said substrate and making electrical node contact for said storage capacitor to said device source/drain;
    depositing a second insulating layer over said first polysilicon layer; and
    masking and anisotropically etching a ringed opening in said second insulating layer over and within said storage capacitor area and aligned to said device source/drain;

depositing a third insulating layer over and in said ringed opened elsewhere over said second insulating layer having a different composition from said second insulating layer and forming a diffusion barrier to oxidizing atomic species;

anisotropically etching back said third insulating layer to surface of said first polysilicon layer in said ringed opening and forming sidewall spacers on said second insulating layer sidewalls;

thermally and partially oxidizing said first polysilicon layer between said sidewall spacers and forming a thermal oxide layer centered in said second insulator ringed opening;

removing completely said sidewall spacers between said second insulating layer and said thermal oxide layer thereby forming an etch mask for said first polysilicon layer;

anisotropically and partially etching said first polysilicon layer forming a double recessed trench in said first polysilicon layer;

removing completely said thermal oxidized layer and said second insulating layer;

selectively patterning said first polysilicon layer to said first insulating layer over said metal-oxide-semiconductor field-effect-transistor area and forming a bottom capacitor electrode of said storage capacitor depositing a dielectric layer over said bottom electrode and forming an inter-electrode insulating layer;

depositing a second polysilicon layer over said dielectric layer forming a top capacitor electrode and making contact of said storage capacitor to said device source/drain and completing said DRAM cell.

13. The method of claim 12, wherein said first insulating layer is a layer of silicon oxide and having a thickness of between about 1000 to 8000 Angstroms.

14. The method of claim 12, wherein the thickness of said first polysilicon layer is between about 500 to 10000 Angstroms.

15. The method of claim 12, wherein said first polysilicon layer is deposited by chemical vapor deposition and having a thickness of between about 500 to 10000 Angstroms.

16. The method of claim 15, wherein said first polysilicon layer is doped N-type having a concentration of between about 1 E 19 to 1 E 22 atoms/cm$^3$.

17. The method of claim 12, wherein said second insulating layer is silicon oxide having a thickness between about 500 to 5000 Angstroms.

18. The method of claim 12, wherein said third insulating layer is silicon nitride having a thickness between 300 to 5000 Angstroms.

19. The method of claim 12, wherein said partial thermal oxide layer in said exposed polysilicon area is between about 200 to 2000 Angstroms in thickness.

20. The method of claim 12, wherein said partial etch depth of said first polysilicon layer is between about 900 to 9000 Angstroms.

21. The method of claim 12, wherein said inter-electrode insulating layer is composed of silicon oxide and silicon nitride.

22. The method of claim 12, wherein said node contact is a source/drain area of a said metal-oxide-semiconductor field-effect-transistor (MOSFET) and said storage capacitor is a part of said dynamic random access memory (DRAM) cell.

* * * * *